(12) United States Patent
Fister

(10) Patent No.: US 6,285,609 B1
(45) Date of Patent: Sep. 4, 2001

(54) METHOD AND APPARATUS FOR TESTING MEMORY DEVICES

(75) Inventor: Wallace E. Fister, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/376,528

(22) Filed: Aug. 18, 1999

Related U.S. Application Data

(62) Division of application No. 09/169,486, filed on Oct. 9, 1998.

(51) Int. Cl.$^7$ ..................................................... G11C 7/00
(52) U.S. Cl. .................. 365/201; 371/21.1; 371/21.2; 365/233; 395/182.03; 395/183.18
(58) Field of Search ................................. 365/201, 233; 371/21.1, 21.2; 395/182.03, 183.18

(56) References Cited

U.S. PATENT DOCUMENTS 5,959,915 * 9/1999 Kwon et al. ........................ 365/201
5,966,388 * 10/1999 Wright et al. ...................... 371/21.2

* cited by examiner

Primary Examiner—Richard Elms
Assistant Examiner—VanThu Nguyen
(74) Attorney, Agent, or Firm—Dorsey & Whitney LLP

(57) ABSTRACT

A test circuit for functionally testing memory devices. The test circuit loads a plurality of data bits into the memory device under test. The test circuit subsequently reads the data bits stored in the memory cells, and detects if the logic level of the data bits read is the complement of the logic level written. The logic level is detected over a duration during which at least two data bits are read.

16 Claims, 4 Drawing Sheets

METHOD AND APPARATUS FOR TESTING MEMORY DEVICES

CROSS-REFERENCE TO RELATED APPLICATION

This application is a divisional of pending U.S. patent application Ser. No. 09/169,486, filed Oct. 9, 1998 now pending.

TECHNICAL FIELD

The present invention relates generally to the testing of semiconductor memories, and more specifically to a method and apparatus for increasing the speed of testing memory devices.

BACKGROUND OF THE INVENTION

During the manufacture of semiconductor memories, such as synchronous dynamic random access memories ("SDRAMs"), it is necessary to test each memory device to ensure that it is operating properly. One test performed on memory devices is the ability to accurately store data, sometimes known as functional testing. Typically this is implemented by writing a single data bit having a specific logic level, such as a logic one, into a single memory cell, and then reading the logic level of the data bit stored in that memory cell. If the logic level read is the same as the logic level that was written into that memory cell, then the memory cell has accurately stored the data bit, and the memory cell passes the test. If, however, the logic level of the data bit read from that memory cell is different than the logic level of data bit that was written into it, then the memory cell has not accurately stored the data bit, and the memory cell fails the test. These steps are then repeated until every memory cell in the memory device has been tested.

Functional testing typically requires three operations. First, a tester writes a data bit into the memory device under test. Second, the tester reads the data bit that was stored in the memory device. Third, the tester compares the logic level of the data bit read from the memory device with the logic level of the data bit that was written into the memory device. In order to compare the logic levels of the two data bits (one written, one read), the tester must generate or store the data bits that were written to the memory device. This allows the data bits that were written to be available to the tester when it compares the data bits read against the data bits that were written. The data bits written are typically algorithmically generated or stored in a data source device that is part of the tester, i.e., a data source device other than the memory device under test. Thus, a data source device is required for functional testing.

Every time the data bit read is compared to the data bit written, the tester must fetch from the data source device the data bits that were written to the memory device under test. This fetching requires a relatively large amount of time and increases the length of time it takes to test a memory device. Several factors limit the speed at which read cycles can be performed on a tester. The ability of the data source to supply the required compare data for the read (or write) cycle takes time. For redundancy purposes, failures that occur during a read cycle must be stored in a Catch RAM ("CRAM") in the tester in order to facilitate redundancy analysis at a later time. The ability to write to the CRAM takes time, thereby limiting the speed of the read cycle. The speed at which the tester strobe (the strobe controls when the comparison of read data will take place and for what duration) can be repeated is limited by the tester circuitry. Thus, the frequency of the strobe limits the speed of the read cycle.

The three examples given above show how the read cycle time can be limited on a tester. This is significant because it is often possible to clock the device under test (DUT) at a much faster speed than the data source, CRAM, and read strobe can operate. Basically this means that the tester can exercise the part at a much greater speed than the tester's ability to verify correct functionality (typically done during a read cycle for RAMS). This is in fact the case for many memory tester vendors and the machines they produce for the purpose of functionally testing memory devices.

One example of a typical tester is a window strobe tester. A window strobe tester is active for a duration of time, the duration being known as a "window." During this window, the tester determines if a single data bit read from the memory device under test has a specific logic level corresponding to the logic level of the stored data bit. The window is timed such that the data bit read from the memory device will be available during the entire period of the window. The tester checks for the specific logic level for the entire duration of the window. If that logic level is present during the entire window, it is assumed that the memory cell that stored that data bit has functioned correctly. Similarly, if the specific logic level is not present at any time during the window, it is assumed that the memory cell that stored that data bit has not functioned correctly.

One problem that exists with conventional memory testers is the result of a maximum operating speed of the tester. Each tester is designed to operate up to a particular operating speed. This speed typically does not change over the life of the tester. However, the operating speed of memory devices does change over time, and often increases greatly during the useful life of a tester. For example, a tester may have an operating speed of 16 MHz. During the first year of its use, the memory devices it tests may also have an operating speed of 16 MHz. However, the next year, the memory devices may have increased their operating speed to 64 MHz due to rapid advancements in technology. This results in a tester that can only test at one quarter (16 MHz/64 MHz=¼) of the operating speed that technology allows. Thus, as technology allows for faster memory devices, the tester is not capable of testing the memory device at the full operating speed of the memory device.

It is desirable to have a tester that can test the memory devices at the maximum operating speed of the memory device. Testing memory devices at less than the maximum operating speed of the memory device may fail to find memory devices that will function satisfactorily at slower operating speeds but will fail to operate at the maximum operating speed. Also, testing memory devices at higher speeds allows more memory devices to be tested in a given amount of time. One way to test memory devices having ever increasing maximum operating speeds is to replace the tester with a new, faster tester each time the technology increases the operating speed of memory devices. This approach, however, can be quite expensive.

Thus, there is a need to allow memory testers to continue to be able to test memory devices at the maximum operating speeds of the memory devices as the maximum operating speeds increase beyond the operating speeds of the testers.

SUMMARY OF THE INVENTION

The present invention provides apparatus and methods for testing a memory device. A test circuit causes at least two data bits having a first logic level to be stored in respective memory cells of a memory device under test, and subsequently serially reads at least two data bits from the memory cells. The test circuit sequentially examines the logic level of the data bits read over a period of time that is part of the period that the data bits are available from the memory device. If the logic level changes during this period or is other than the first logic level, the memory cells from which the data bits are read are considered to be defective.

DETAILED DESCRIPTION OF THE INVENTION

Figure 1:
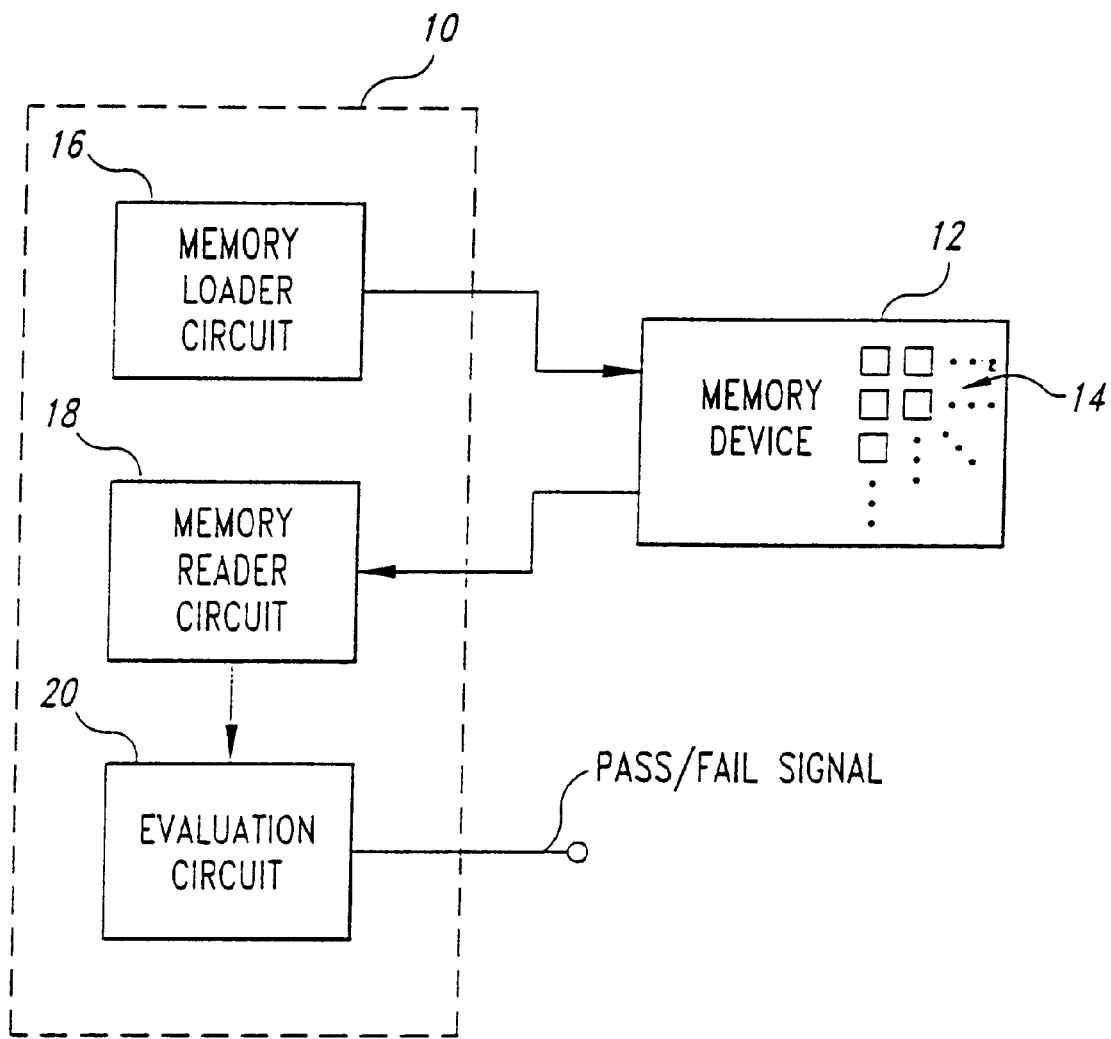
FIG. 1 is functional block diagram of a test circuit in accordance with several embodiments of the present invention.

FIG. 1 is functional block diagram of a tester 10 in accordance with one embodiment of the invention. The tester 10 is coupled to a memory device 12 under test that has a plurality of memory cells 14. With reference to FIG. 1, the test circuit 10 includes a memory loader circuit 16 for writing the data bits into the memory device 12, a memory reader circuit 18 for reading the data bits stored in the memory device 12, and an evaluation circuit 20 for determining if a logic level written is not present for the entire duration of the window. In one embodiment, the evaluation circuit 20 may determine if the data bit read is below or above the threshold determined for a logic "1" or "0" respectively of the logic level written, or is tri-stated at any time during a test window. Those skilled in the art will realize that the various functions of each individual circuit 16–20 may be combined with one or more of the other individual circuits 16–20.

In operation, the tester 10 causes a plurality of data bits having a first logic level to be stored in all of the memory cells 14 of the memory device 12 that are to be tested during a single test period. The data bits may be loaded into the memory cells 14 to be tested by a variety of ways known to those skilled in the art, including a conventional write operation. In the interest of brevity, the term "writing" and its conjugate words will be used to mean all methods known to those skilled in the art of loading a memory cell 14 with a data bit.

The tester 10 includes a memory loader circuit 16 that generates data bits having a predetermined logic level in a plurality of memory cells that include all of the memory cells that are read during a single test period. The number of memory cells to which the data bits are written may be all of the memory cells 14 in the memory device 12 or a subset of the memory cells 14 in the memory device 12. The tester 16 also includes a memory reader circuit 18 that reads a plurality of data bits stored in respective memory cells in the memory device 12 during a single test period. The combination of storing and reading a data bit jointly makes up a single device cycle. The device cycle is typically composed of a single write cycle and a single read cycle.

The memory reader circuit 18 in the tester 10 couples the data bits read during the test period to an evaluation circuit 20. The evaluation circuit 20 determines if the logic level of the data bits read from the memory device 12 corresponds, for the entire duration of the test period, to the logic level of the data bits written. This determination makes up a tester cycle. The evaluation circuit 20 may perform this analysis using a variety of techniques.

The compare operation occurs over a period of time, known as a window, with the comparing occurring continuously throughout the window. The duration of the window is such that at least two of the data bits read are examined to determine if the voltage/logic level of the data bits written is present during the entire window.

If the memory device 12 is operating properly, the data bits read from the memory cells 14 correspond to the data bits written to the memory cells 14. If the tester 10 detects the logic level written to the memory cells 14 during the entire window, ie., a logic "1" is detected when a logic "1" was written, or similarly for a logic "0", the portion of the memory device 12 being tested, i.e., the memory cells 14 from which the data bits are being read, passes the functional test. Conversely, if the tester 10 does not detect the required logic level written to the memory cells 14 at all times during the window, e.g., a logic "1" is not detected at any time when a logic "1" was stored, the portion of the memory device 12 being tested fails the functional test.

Significantly, it is not necessary to compare each of the data bits read from the memory device 12 to each data bit written to the memory device 12 because a single known logic level is stored in all of the memory cells 14 that are to be tested during each window. The compare operation performed by the evaluation circuit 20 can be accomplished by any of several appropriate methods known to those skilled in the art. Because no fetching operation is necessary to retrieve the logic levels of the data bits originally written into the memory cells 14, the data bits can be compared at the same rate that they are output from the memory device 12. This increases the speed at which the test circuit 10 can functionally test the memory device 12.

In addition to evaluating the data bits read during the window using a comparison, the evaluation circuit may evaluate the data bits read using other techniques. For example, if the memory cells tested during a test period are functioning properly, the logic level of the data bits read from the memory device 12 will not change during the test period, unless all of the memory cells have failed. For example, if a logic "0" were written into a group of memory cells, and, at any time during the window, a transition to a logic "1" or to a state other than a logic "0" by the data bits read from the memory cells is detected, at least one of the memory cells being tested is defective. Thus, the evaluation circuit 20 can simply detect any change in the logic level of the data bits read during the window to determine if the memory cells read are defective. However, this technique may be less reliable than the aforementioned comparison technique because, as explained above, it will fail to detect defects affecting all of the memory cells read during a window, e.g., a logic "0" is written, and only logic "1"'s are read.

Figure 2A:
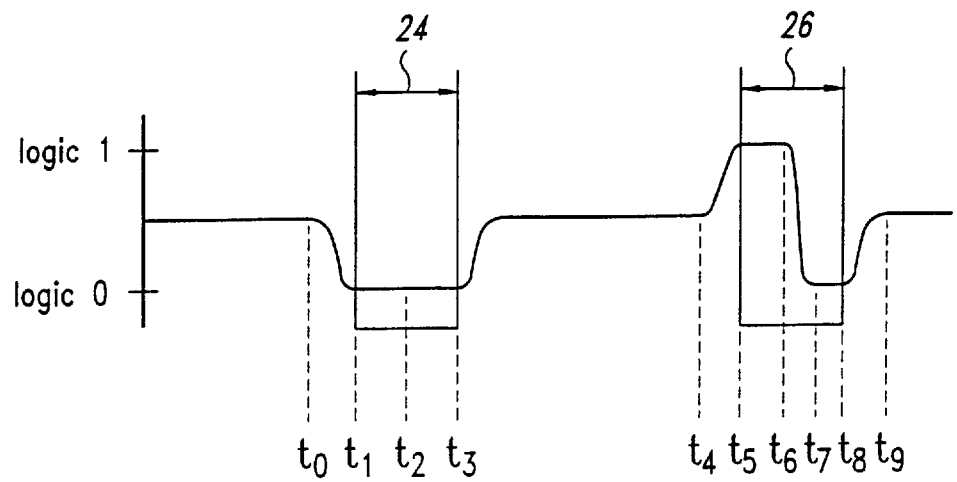
FIG. 2A is a timing diagram showing various signals present in the test circuit of FIG. 1 when comparing data bits.

The operation of the tester 10 of FIG. 1 is illustrated in FIG. 2A. As seen in FIG. 2A, rectangular boxes represents the time period during which the evaluation circuit 20 performs its evaluation, i.e., the windows 24, 26. At a time prior to $t_0$ a data bit having a logic level of "0" is written into a first and second memory cells 14 in the memory device 12. At time $t_0$ the logic level of the data bit stored in the first memory cell 14 is read, and shortly thereafter, a first window 24 begins at time $t_1$. The delay between times $t_0$ and $t_1$ allows the logic level to be coupled to the evaluation circuit 20. At time $t_2$ the logic level of the data bit stored in the second memory cell 14 is read, and is coupled to the evaluation circuit 20. The first window 24 ends at time $t_3$. As shown, a logic "0" is read at times $t_1$ and $t_2$, and throughout the entire first window 24. Therefore, the logic level written was detected during the entire first window 24, and the logic level remains constant during the first window 24. Both the first and the second memory cells 14 are thus considered to pass the functional test.

Figure 2B:
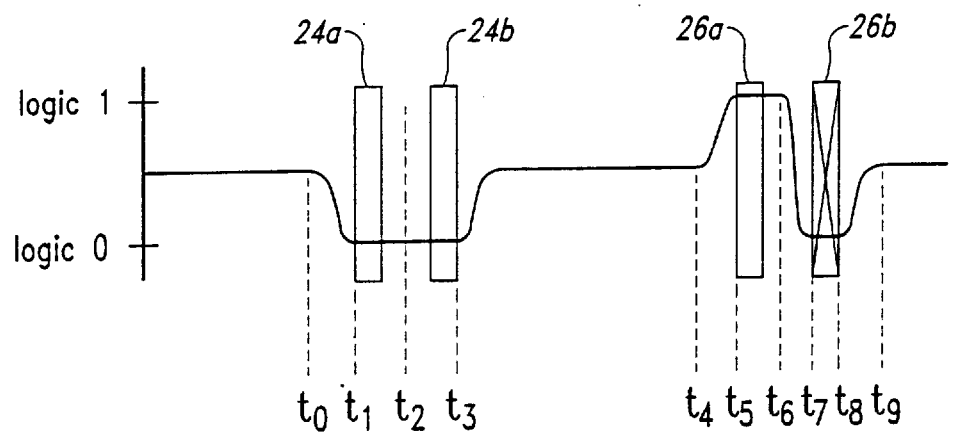
FIG. 2B is a timing diagram showing various signals present in a convention tester when comparing data bits.

At a time prior to $t_4$, a third and fourth data bits having a logic "1" are written into a third and fourth memory cells 14 respectively. At time $t_4$ the logic level of the data bit stored in the third memory cell 14 is read, and shortly thereafter, the second window 26 begins at time $t_5$. At time $t_6$ the logic level of the data bit stored in the second memory cell 14 is read and has reached a logic "0" level by time $t_7$. The second window 26 then ends at time $t_8$. As shown, during the second window 26, a logic "1" is read at a time $t_5$ and a logic "0" is read at a time $t_7$. Therefore, the logic level written was not detected during the entire second window 26, i.e., a state other than the logic level written was detected, and the logic level changed during the window 26. A failure of the memory cells 14 is thus considered to have occurred during the testing of the third and fourth memory cells 14. As discussed above, a conventional window strobe detects if the logic level of a data bit written to a memory device is present for the entire duration of the window. Thus, as shown in FIG. 2b, conventional testing techniques would require that two independent strobes be used at times $t_1$ through $t_3$, where a first strobe 24a would start on or after $t_1$ and end before or at $t_2$, and a second strobe 24b would start on or after $t_2$ and end before or at $t_3$. With two strobes placed between $t_1$ and $t_3$, both strobes would detect a pass given that a "0" was expected for both data bits. Thus, conventional testing techniques would also require that two independent strobes would be used at $t_5$ through $t_8$, where a third strobe 26a would start on or after $t_5$ and end before or at $t_6$, and a fourth strobe 26b would start on or after $t_7$ and end before or at $t_8$. In this case the third strobe 26a would detect the expected logic level and thus pass, as a logic "1" was expected. However, the fourth strobe 26b would detect a fail because a logic "1" level was not maintained for the entire duration of the fourth strobe 26b.

The significance between the disclosed embodiment of the invention and the conventional testing techniques can be understood in knowing that the minimum time between $t_0$ and $t_9$ in FIG. 2A would be n, and the minimum time between $t_0$ and $t_9$ for FIG. 2B would be approximately 2n. Although current technology limits the minimum duration of each strobe, by reducing the number of strobes the duration needed to test a given number of data bits (and therefore a given number of memory cells) is also reduced.

Further, as mentioned above, each time a strobe is used, a CRAM cycle also occurs. A CRAM cycle encompasses the storage of failures for later analysis, and requires a specific amount of time to be completed. For each strobe, a CRAM cycle is performed. Thus, reducing the number of strobes also reduces the number of CRAM cycles, further shortening the amount of time it takes to test a given number of memory cells. Those skilled in the art will recognize that further savings in time may also occur as a result of reducing the number of strobes.

The above time savings result in a test sequence testing two data bits per strobe having approximately half the duration of the same test sequence testing only one data bit per strobe. Thus, if reading two bits of data with the invention, a device cycle that is twice the rate of conventional testing can be achieved. Further increases in device cycle time may result from testing even more data bits per window strobe.

As seen in FIG. 2A, more than one data bit can be examined during a single window 24, 26. In fact, the evaluation can be conducted with any number of data bits being written and read from the memory device 12 under test. This can further increase the speed at which the tester 10 functionally tests the memory device 12. By using a single window 24, 26 to examine multiple data bits, the evaluation circuit 20 only needs to be activated once per window 24, 26.

The above embodiment assumes that the output of the data bits read from the memory device 12 remains latched between clock cycles, as is typical for many memory devices 12, such as synchronous DRAMs, for example. This allows the logic level read by the test circuit 10 to remain constant between clock cycles, rather than defaulting to a default logic level. This is significant because, as discussed above, the test circuit 10 typically compares the data bits read continuously with the logic level written. If an input to the test circuit 10 were to default to a logic "0", for example, between clock cycles, when the logic level written is a logic "1", the test circuit 10 would detect the default logic "0". Because a state other than the logic level written would be detected, the test would indicate a bad memory cell 14 existed regardless of the accuracy of the test cell to store data bits.

In another embodiment of the invention (not shown), the test circuit 10 produces a fail signal when the logic level written is not detected during the entire compare operation. As discussed above, if the logic level written is not detected during the entire compare operation, at least one of the memory cells 14 being tested did not store the logic level of the data bit written into the memory cells 14.

In another embodiment of the invention (not shown), the test circuit 10 produces a pass signal when the logic level written is detected during the entire compare operation. As discussed above, if the logic level written is detected during the entire compare operation, the memory cells 14 being tested stored the logic level of the data bit written into the memory cells 14.

In another embodiment, the test circuit 10 may write to the memory device 12 in its entirety, i.e., every cell 14 in the memory device 12, before reading the logic levels of the data bits from the memory device 12. Alternatively, the test circuit 10 may write to only a portion of the memory cells 14 within the memory device 12 before reading the logic levels of the data bits. The test circuit 10 may also read the logic levels from more memory cells 14 than were written to during the functional testing. In this situation, the memory cells 14 read by the test circuit 10 that were not written to during functional testing are typically written to before functional testing begins, either by the test circuit 10 or by some other method or apparatus.

Figure 3:
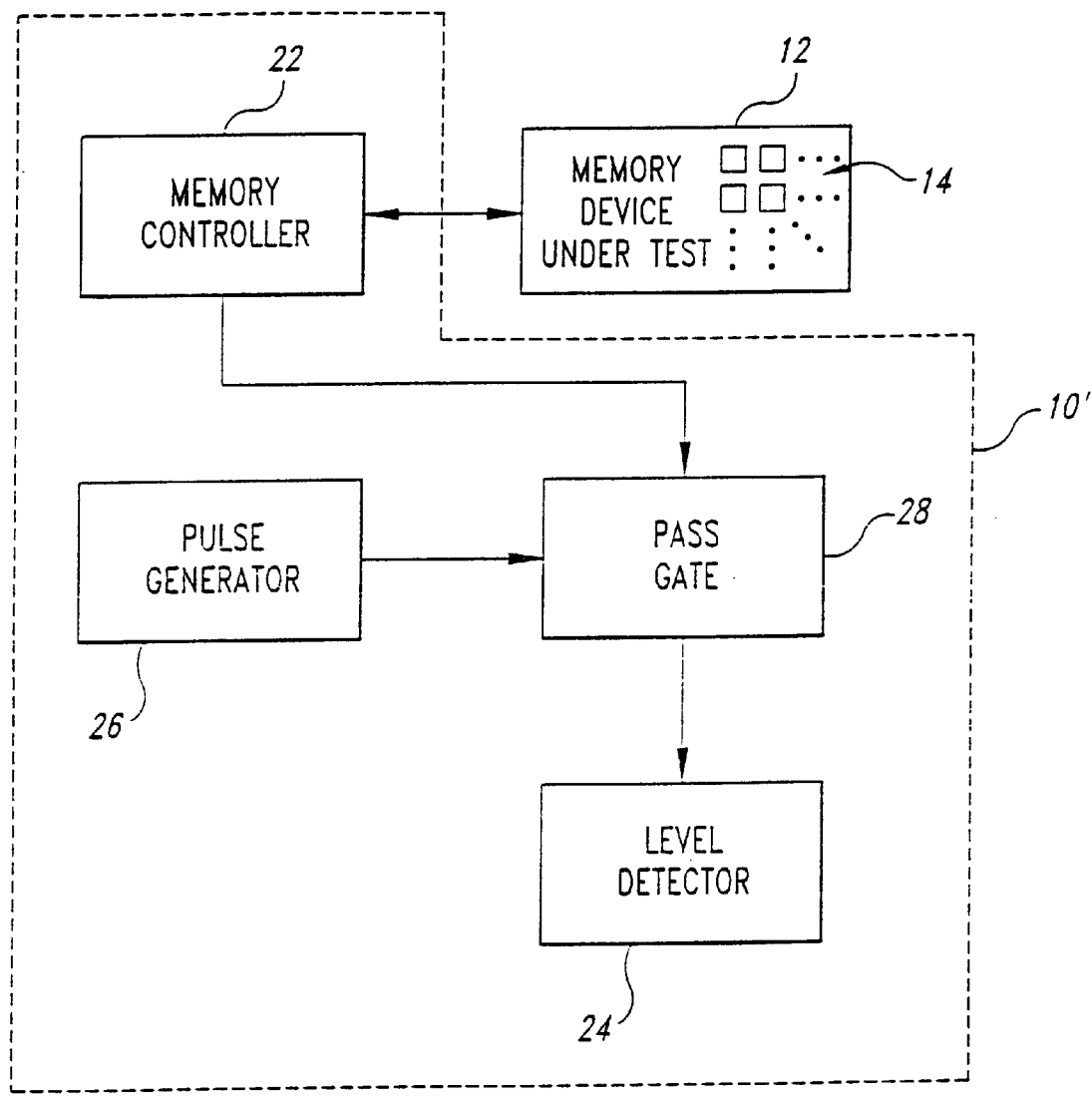
FIG. 3 is functional block diagram of a test circuit in accordance with several embodiments of the present invention.

Another embodiment of a tester 10' is shown in FIG. 3. The tester 10' may include a memory controller 22 for writing and reading the data bits, a level detector 24 for monitoring the data bits read for the predetermined logic level, and control circuitry, such as a pulse generator 26, and a pass gate 28 for controlling the data bits being sent to the level detector 24. The structure and operation of these elements are described more fully below.

The memory controller 22 is coupled to the memory device 12 under test. The memory controller 22 writes the plurality of data bits having a first logic level into the memory device 12. After the memory device 12 has stored the plurality of data bits, the memory controller 12 reads the plurality of data bits stored in the memory device 12. If the memory device 12 is operating properly, the data bits read from the memory cells 14 correspond to the data bits written into the memory cells 14. The memory controller 12 outputs the plurality of data bits read from the memory device 12. The pass gate 28 receives the data bits read from the memory device 12. The pass gate 28 is also coupled to the pulse generator 26.

The pulse generator 26 generates a timing signal, such as a window strobe signal, that selectively renders the pass gate 28 conductive so that the data read from the memory device 10 is coupled to the output of the pass gate 28. The timing signal is synchronized with the output of the plurality of data bits read from the memory device 12. The timing signal may be generated in response to receiving a synchronization signal from the memory controller 12. The pass gate circuit 28 passes, i.e., transmits, the data bits received from the memory controller 16 for the duration that the pass gate 28 receives the timing signal. The duration of the timing signal is such that at least two data bits pass through the pass gate circuit 28. In one embodiment the pass gate circuit 28 may latch each of the data bits read.

The level detector 24 is coupled to the pass gate 28 to receive the data bits coupled through the pass gate 28. The level detector 24 compares the logic levels of the plurality of data bits coupled through the pass gate 28 with the logic level written. The level detector 24 may be programmed to detect a particular logic or voltage level by ways apparent to those skilled in the art.

In one embodiment, the level detector 24 may produce a fail signal when the logic level written is not detected during the entire window, as described above. In another embodiment, the level detector 24 may produce a pass signal when the logic level written is detected, as described above.

Figure 4:
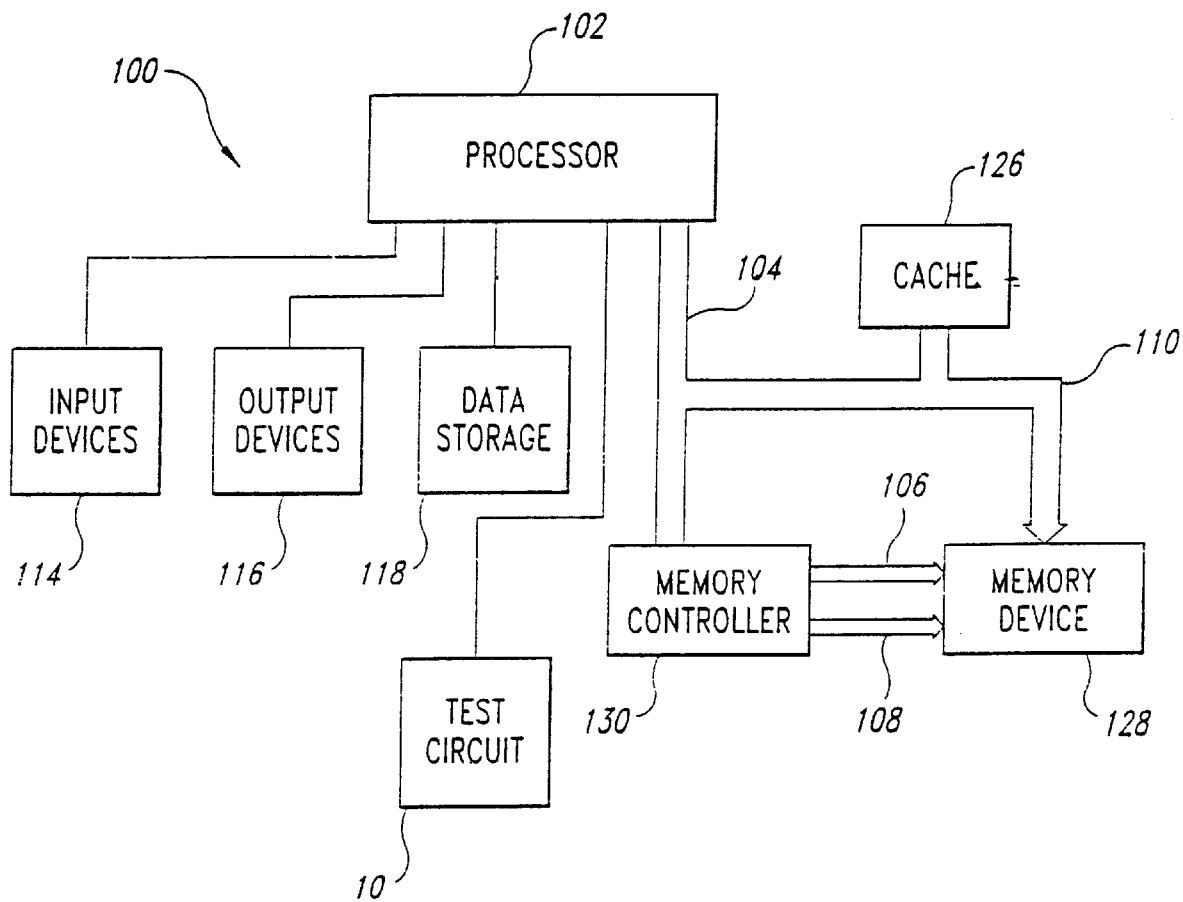
FIG. 4 is a functional block diagram showing the test circuit of FIG. 1 used in a conventional test system.

FIG. 4 is a block diagram of test system 100 that includes the test circuit 10 of FIG. 1. The test system 100 includes a processor 102 for performing various computing functions, such as executing specific software to perform specific calculations or tasks. The processor 102 includes a processor bus 104 that normally includes an address bus, a control bus, and a data bus.

In addition, the test system 100 includes one or more input devices 114, such as a keyboard or a mouse, coupled to the processor 102 to allow an operator to interface with the test system 100. Typically, the test system 100 also includes one or more output devices 116 coupled to the processor 102, such output devices typically being a printer or a video terminal. One or more data storage devices 118 are also typically coupled to the processor 102 to store data or retrieve data from external storage media (not shown). Examples of typical storage devices 118 include hard and floppy disks, tape cassettes, and compact disk read-only memories (CD-ROMs). The processor 102 is also typically coupled to cache memory 126, which is usually static random access memory ("SRAM") and to a memory device 128 through a memory controller 130. The memory controller 130 normally includes the control bus and the address bus that is coupled to the memory device 128. The data bus may be coupled to the processor bus 104 either directly (as shown), through the memory controller 130, or by some other means. The test circuit 10 is coupled to the processor 102 through the processor bus 104. The test circuit 10 may be coupled to the memory device 12 under test (not shown), and functions as described above. Further discussion is omitted in the interest of brevity.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A test apparatus for testing a first memory device, the first memory device having a plurality of memory cells each of which is structured to store a data bit, one data bit per memory cell, the test apparatus comprising:
   a processor having a processor bus;
   an input device coupled to the processor through the processor bus and structured to allow data to be entered into the test apparatus;
   an output device coupled to the processor through the processor bus and structured to allow data to be output from the test apparatus;
   a second memory device coupled to the processor through the processor bus, the second memory device structured to store a plurality of data bits; and
   a test circuit coupled to the processor, the test circuit comprising:
      a memory loader circuit coupled to the first memory device, the memory loader circuit structured to cause a plurality of data bits having a first logic level to be stored in the memory cells;
      a memory reader circuit coupled to the first memory device, the memory reader circuit structured to serially read a plurality of data bits from the memory cells after the memory loader circuit causes the plurality of data bits to be stored in the memory cells, and structured to output a plurality of the data bits read; and
      a comparator circuit coupled to the memory reader circuit to receive the plurality of data bits output, the comparator circuit structured to sequentially compare, for a predetermined duration of time, the plurality of data bits output with the first logic level.

2. The test apparatus of claim 1 wherein the comparator circuit compares the voltage level of the plurality of data bits output with a voltage level corresponding to the first logic level.

3. The test apparatus of claim 1 wherein the memory reader circuit comprises a circuit structured to read the data bits stored in all of the memory cells that were written to by the memory loader circuit.

4. The test apparatus of claim 1 wherein the memory reader circuit comprises a circuit structured to output all of the data bits read.

5. The test apparatus of claim 1 wherein the memory reader circuit further comprises a latch circuit structured to latch each of the data bits read by the circuit memory reader.

6. The test apparatus of claim 1 wherein the first logic level comprises a logic one.

7. The test apparatus of claim 1 wherein the first logic level comprises a logic zero.

8. The test apparatus of claim 1, further comprising a signal generator circuit structured to output a fail signal when the logic level of a data bit read by the memory reader circuit does not correspond to the first logic level.

9. The test apparatus of claim 1, further comprising a signal generator circuit structured to output a pass signal when the logic level of all of the data bits read corresponds to the first logic level.

10. A method for testing a memory device, the memory device having a plurality of memory cells for storing a plurality of data bits, the method comprising the steps of:

conducting a plurality of device cycles to the memory device, each device cycle comprising:

loading a data bit having a first logic level into a memory cell; and causing the memory device to output a data bit from a memory cell that was loaded; and conducting a single tester cycle for each of the plurality of device cycles, each tester cycle comprising detecting if the logic level of a plurality of the data bits output is the first logic level.

11. The method of claim 10 wherein the plurality of data bits for which the logic level is detected during a tester cycle comprises all of the data bits output from the memory device.

12. The method of claim 10, further comprising latching the data bit read between device cycles.

13. The method of claim 10 wherein the first logic level comprises a logic one.

14. The method of claim 10 wherein the first logic level comprises a logic zero.

15. The method of claim 10, further comprising generating a fail signal when the logic level of a data bit read does not correspond to the first logic level.

16. The method of claim 10, further comprising generating a pass signal when the logic level of all of the data bits read corresponds to the first logic level.

* * * * *